(12) United States Patent
Chen et al.

(10) Patent No.: US 8,771,534 B2
(45) Date of Patent: *Jul. 8, 2014

(54) MANUFACTURING TECHNIQUES FOR WORKPIECES WITH VARYING TOPOGRAPHIES

(75) Inventors: Chun-Chang Chen, Tainan (TW); Shih-Chi Fu, Hsinchu County (TW); Wang-Pen Mo, Pingtung County (TW); Hung-Chang Hsieh, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/350,010

(22) Filed: Jan. 13, 2012

(65) Prior Publication Data

US 2013/0181320 A1    Jul. 18, 2013

(51) Int. Cl.
*B44C 1/22*    (2006.01)

(52) U.S. Cl.
USPC ............. 216/47; 216/49; 438/689; 438/717; 438/736

(58) Field of Classification Search
None
See application file for complete search history.

(56) References Cited

U.S. PATENT DOCUMENTS

2005/0054194 A1*    3/2005    Tsai et al. ................. 438/638

OTHER PUBLICATIONS

S. Wolf and R.N. Tauber, "Silicon Processing for the VLSI Era", vol. 1, Lattice Press, 2000, p. 524.*
U.S. Appl. No. 13/306,299, filed Jan. 13, 2012. 22 Pages.
Non-Final Office Action dated Mar. 22, 2013 for U.S. Appl. No. 13/306,299. 11 Pages.
Final Office Action dated Jul. 17, 2013 for U.S. Appl. No. 13/306,299. 10 Pages.
Notice of Allowance dated Sep. 13, 2013 for U.S. Appl. No. 13/306,299. 17 Pages.
J. Webster (ed.), Wiley Encyclopedia of Electrical and Electronics Engineering, year 1999, pp. 300-320.
MNX: MEMS & Nanotechnology Exchange. "Guide: Lithography Pattern Transfer." Retrieved on Jan. 17, 2014. Published on Jun. 9, 2010. 10 Pages.

* cited by examiner

*Primary Examiner* — Lan Vinh
*Assistant Examiner* — Jiong-Ping Lu
(74) *Attorney, Agent, or Firm* — Eschweiler & Associates, LLC

(57) ABSTRACT

Some embodiments relate to a method for processing a workpiece. In the method, an anti-reflective coating layer is provided over the workpiece. A first patterned photoresist layer, which has a first photoresist tone, is provided over the anti-reflective coating layer. A second patterned photoresist layer, which has a second photoresist tone opposite the first photoresist tone, is provided over the first patterned photoresist layer. An opening extends through the first and second patterned photoresist layers to allow a treatment to be applied to the workpiece through the opening. Other embodiments are also disclosed.

16 Claims, 5 Drawing Sheets ly high aspect ratio features 102 as well as relatively short

MANUFACTURING TECHNIQUES FOR WORKPIECES WITH VARYING TOPOGRAPHIES

BACKGROUND

Modern integrated circuits (ICs), which may also be referred to as "chips", are made up of alternating conducting layers and insulating layers which are formed over a semiconductor substrate. The alternating conducting and insulating layers collectively establish electrical connection to active regions of devices in the semiconductor substrate (e.g., source/drain regions of a MOSFET or emitter/base/collector regions of a BJT in the substrate). Exterior pins or pads, which are often electrically connected to an upper conducting layer, allow the semiconductor devices to send and receive signals to and from exterior electrical components, such as other circuits or audio/visual input/outputs, for example.

In many cases, the conducting and insulating layers over different types of devices can have different topographies. For example, at some stages during manufacture, a single IC can include low-voltage logic devices having one topography (e.g., a polysilicon layer exhibiting short sidewalls having a low aspect ratio) as well as FinFETS and/or flash memory devices that have other topographies (e.g., a polysilicon layer exhibiting tall, steep sidewalls having a high aspect ratio). Although the use of these different topographies allows integration of several different types of devices onto a single integrated circuit, the variation in aspect ratio and/or height (e.g., relative to a top surface of the substrate) for these different types of devices can lead to challenges in the manufacturing process.

To help streamline the manufacturing process of such devices on a single integrated circuit, this disclosure provides improved manufacturing processes.

DETAILED DESCRIPTION

Figure 1A:
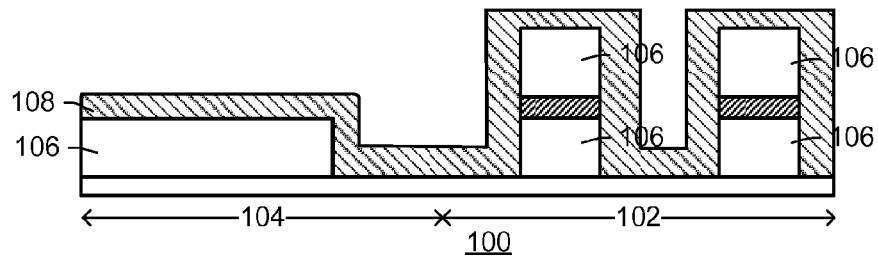
FIGS. 1A-1D are cross-sectional views that collectively illustrate a semiconductor process flow which suffers from some shortcomings, as appreciated by the inventors.

One or more implementations of the present invention will now be described with reference to the attached drawings, wherein like reference numerals are used to refer to like elements throughout. The drawings are not necessarily drawn to scale.

Figure 1B:
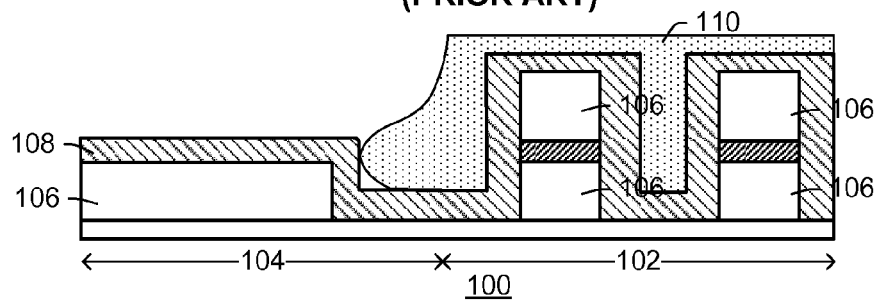
Figure 1C:
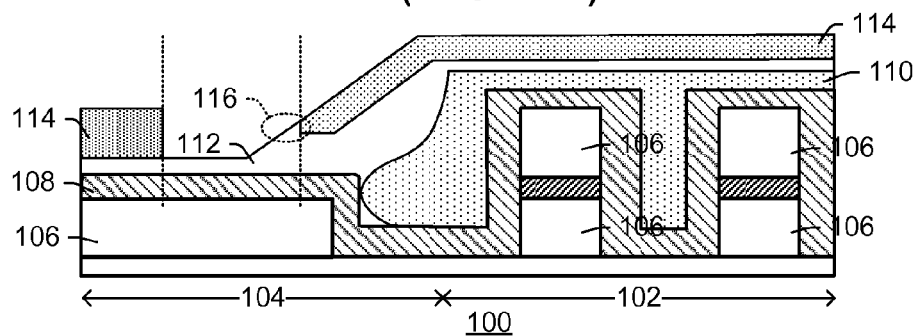
Figure 1D:
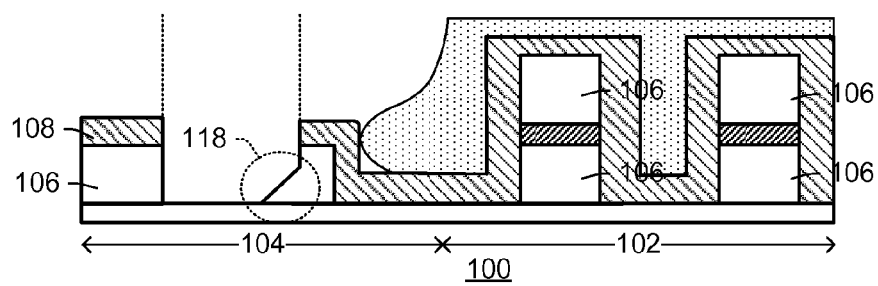

As will be appreciated further herein, aspects of the present disclosure relate to manufacturing techniques that use a dual-tone photoresist scheme to improve manufacturing techniques, particularly when workpieces with large variations in feature height and/or aspect ratio are used. As the inventors have appreciated, until now devices that include large variations in feature height and/or aspect ratio have been challenging to manufacture, particularly when bottom anti-reflective coatings are used. For example, FIGS. 1A-1D show a manufacturing process for a workpiece 100 that includes relatively tall or high aspect ratio features 102 as well as relatively short or low aspect ratio features 104. Both types of features 102, 104 can include polysilicon layers 106 covered by a hard mask layer 108. In FIG. 1B, a negative photoresist layer 110 is provided over the relatively tall or high aspect ratio features 102. In FIG. 1C, a bottom anti-reflective coating (BARC) layer 112 is formed over the workpiece, after which a positive photoresist layer 114 is formed and patterned thereover. The BARC layer 112 is helpful in limiting reflection of impingent light back from the hardmask layer 108, and hence, is helpful in reducing the likelihood of standing light-waves (e.g., zero amplitude nodes) in the positive photoresist layer 114. If standing light waves were to occur, the positive photoresist 114 may be difficult to develop in the regions where the zero amplitude nodes occur. Hence, the BARC layer 112 limits or prevents this condition to help improve photoresist developing to improve feature resolution. Notably, however, the inventors have appreciated that a thick BARC region 116, which can occur due to BARC reflow, can form at an edge of the positive photoresist region 114 in some processes. When a subsequent etch is carried out with the patterned positive photoresist 114 in place, polysilicon residue 118 can be left under the previous thick BARC region 116 as shown in FIG. 1D. This poly residue 118 can lead to reliability issues for the resultant IC. Consequently, the manufacturing techniques provided herein limit or prevent polysilicon residue to provide more reliable devices than previously achievable.

As a person of ordinary skill appreciates, photoresist is a light-sensitive material used in several industrial processes, such as photolithography and photoengraving, to form a patterned coating on a workpiece surface. Photoresists are classified according to two types: positive photoresists and negative photoresists. A positive photoresist, which can also be said to have a positive photoresist tone, is a type of photoresist in which the portion of the photoresist that is exposed to light becomes soluble to photoresist developer and the portion of the photoresist that is unexposed to light remains insoluble to the photoresist developer. A negative resist, which can also be said to have a negative photoresist tone, is a type of photoresist in which the portion of the photoresist that is exposed to light becomes insoluble to the photoresist developer while the unexposed portion of the negative photoresist is dissolved by the photoresist developer. Thus, the photoresist tone, which can be either positive or negative, indicates how the photoresist reacts to a combination of light exposure and subsequent exposure to photoresist developer. As will be appreciated in greater detail below, the inventors have appreciated that using a combination of positive and negative photoresist provides some advantages in the manufacture of modern ICs.

Figure 2:
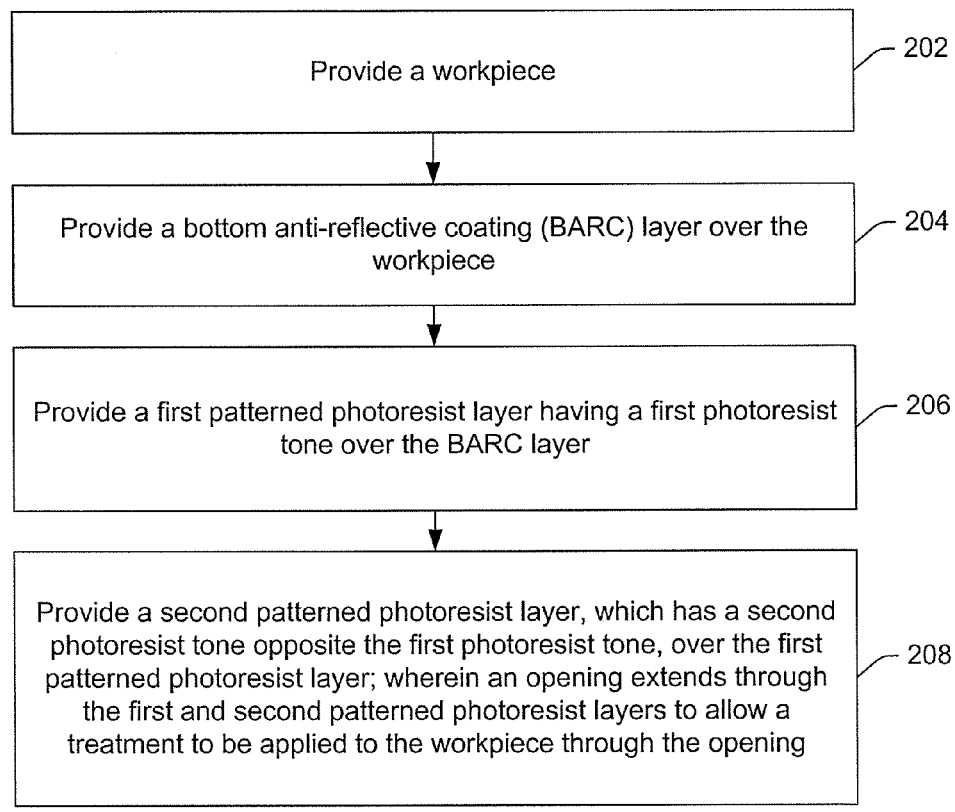
FIG. 2 is a flow diagram illustrating a method of fabricating a semiconductor device in accordance with some embodiments.

Turning now to FIG. 2, one can see a flow diagram of a manufacturing method 200 that uses a dual-tone photoresist scheme in accordance with some aspects of this disclosure. The method 200 starts at 202 when a workpiece is provided. The workpiece can be a semiconductor substrate, a printed circuit board, a photonic material, a microelectrical-mechanical (MEMs) device, or a glass substrate, among others. At 204, a BARC layer is provided over the workpiece. In 206, a first patterned photoresist layer, which has a first photoresist tone, is formed over the BARC layer. At 208, a second patterned photoresist layer, which has a second photoresist tone opposite the first photoresist tone, is formed over the first patterned photoresist layer. An opening extends through the first and second patterned photoresist layers to allow a treatment, such as an etch for example, to be applied to the workpiece through the opening. In comparison to the methodology of FIGS. 1A-1D, which suffered from shortcomings due to formation of thick BARC layer (e.g., 116 in FIG. 1O) and polysilicon residue (e.g., 118 in FIG. 1D), FIG. 2's methodology forms the BARC layer before the negative photoresist layer. Because the BARC layer is formed prior to the negative photoresist layer, method 200 limits or prevents formation of a thick BARC layer and correspondingly limits undesirable polysilicon residue. Thus, more exact or "cleaner" device features are formed, relative to conventional techniques.

To show a specific example consistent with FIG. 2's methodology, FIGS. 3-10 show a series of cross sectional views at various stages of a manufacturing process that uses dual-tone photoresist techniques in accordance with some embodiments. Although these cross-sectional views show one example of how the manufacturing method 200 could be carried out, FIGS. 3-10 do not limit the scope of method 200 in any way. For example, although FIGS. 3-10 are described as using a first photoresist layer having a negative photoresist tone and a second photoresist layer having a positive photoresist tone, these tones can be reversed in other embodiments. Also, the term "relatively" as used in this specification (e.g., as in "relatively tall" and "relatively short" or "relatively high aspect ratio" and "relatively low aspect ratio") refers to the relationship between features on a single integrated circuit and is not necessarily relative to other industry standard features.

In addition, it will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases, and are not limited to the structures illustrated in FIGS. 3-10.

Figure 3:
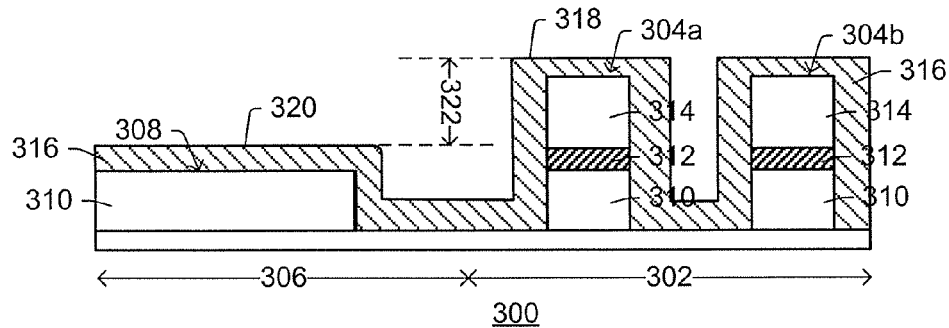
FIGS. 3-10 are cross-sectional views that collectively illustrate a semiconductor process flow making use of two different tones of photoresist to carry out a treatment step in accordance with some embodiments.

FIG. 3 shows a cross-sectional view of a semiconductor workpiece 300 at one stage of manufacture. It will be appreciated that "semiconductor workpiece" as referred to herein may comprise any type of semiconductor material including a bulk silicon wafer, a binary compound substrate (e.g., GaAs wafer), a ternary compound substrate (e.g., AlGaAs), or higher order compound substrates, with or without additional insulating or conducting layers formed thereover, among others. Further, the semiconductor workpiece 300 can also include non semiconductor materials such as oxide in silicon-on-insulator (SOI), partial SOI substrate, polysilicon, insulator, oxide, metal, amorphous silicon, or organic material, among others. In some embodiments, the semiconductor workpiece can also include multiple wafers or dies which are stacked or otherwise adhered together. The semiconductor workpiece can include wafers which are cut from a silicon ingot, and/or any other type of semiconductor/non-semiconductor and/or deposited or grown (e.g. epitaxial) layers formed on an underlying substrate.

In FIG. 3, the semiconductor workpiece 300 includes a first region 302 with relatively tall or relatively-high aspect ratio features 304a, 304b, and a second region 306 with relatively short or relatively-low aspect ratio features 308. In one embodiment, the relatively tall or relatively-high aspect ratio features 304a, 304b can include a first polysilicon layer 310, a first hard mask layer 312 (e.g., made of ONO (Oxide-Nitride-Oxide)), and a second polysilicon layer 314 stacked thereover. A second hard mask layer 316 (e.g., made of nitrided Silicon oxide (SiON)) can also be formed, as shown. The relatively tall or relatively high aspect ratio features 304a, 304b can correspond to FinFET devices or flash memory devices in some embodiments. In contrast, the relatively short or relatively-low aspect ratio features 308 can include a first polysilicon layer 310, and can correspond to a low-voltage logic gate for example. In some embodiments, upper surfaces 318, 320 of the respective regions 302, 306 can be separated by a vertical distance 322 of approximately 3000 angstroms or more. Nonetheless, the processes described herein can also be used for vertical distances of less than approximately 3000 angstroms.

Figure 4:
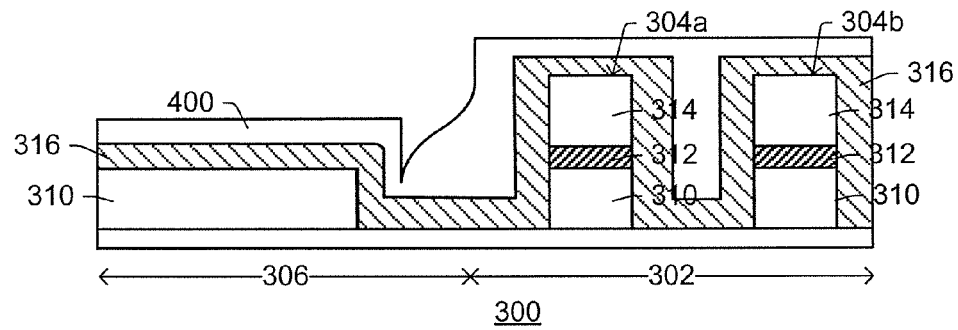

In FIG. 4, a BARC layer 400 is formed over the workpiece. In one embodiment, the BARC layer 400 is formed by dispensing a predetermined volume of BARC solution onto the surface of the workpiece (e.g., near the center of the workpiece), and spinning the workpiece about its central axis to radially disperse the solution over the surface of the workpiece. The workpiece can then be rinsed and dried, and can thereafter be baked to cure the BARC layer 400.

Figure 5:
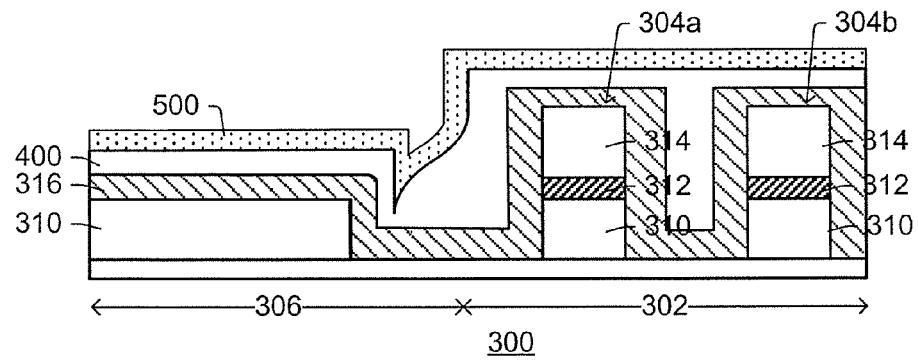

In FIG. 5, a first photoresist layer 500 is formed over the BARC layer 400. In the illustrated embodiment, the first photoresist layer 500 is a negative photoresist layer exhibiting a negative photoresist tone. In one embodiment, the first photoresist layer 500 is formed by dispensing a predetermined volume of photoresist solution onto the surface of the workpiece (e.g., near the center of the wafer), and spinning the workpiece about its central axis to radially disperse the solution over the surface of the workpiece.

Figure 6:
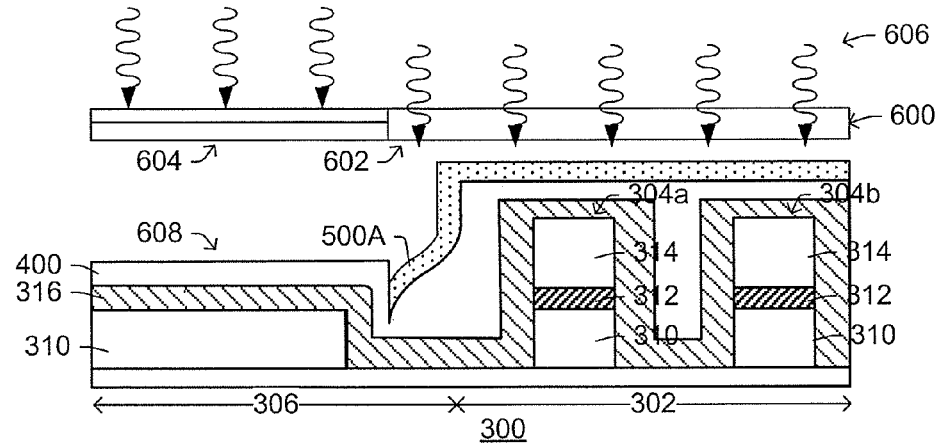

In FIG. 6, a first photomask 600, such as a reticle, is provided over the first photoresist layer. The first photomask 600 includes one or more window regions 602 through which photons can pass and one or more blocking regions 604 that block photons from passing therethrough. After the first photomask 600 is aligned with respect to the workpiece 300, a stream of photons 606 is applied to the workpiece 300 while the first photomask 600 is in place. The stream of photons, which only pass through the window region 602 to strike the negative photoresist over the relatively tall or relatively high-aspect ratio region 302 in this example, "harden" the exposed first photoresist layer, due to the negative photoresist tone for the first photoresist layer in this example. After exposure to the stream of photons 606, the workpiece 300 is subjected to (e.g., immersed in) a photoresist developing agent to form a patterned first photoresist layer 500A. As shown, after being developed, the patterned first photoresist layer 500A includes first opening 608 that exposes a portion of the workpiece. The remaining portion of the patterned first photoresist layer 500A, which was exposed to the stream of photons 606, covers the relatively tall or relatively high-aspect ratio features 304a, 304b for improved protection.

Figure 7:
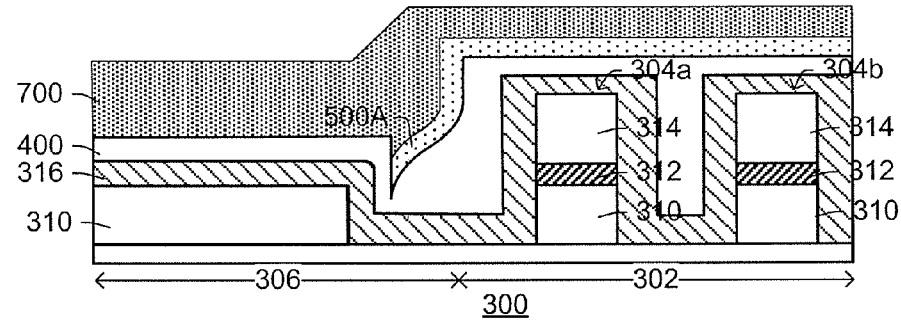

In FIG. 7, a second photoresist layer 700, which has a positive photoresist tone in this example, is provided over the patterned first photoresist layer 500A and the previously exposed portion of the workpiece 608.

Figure 8:
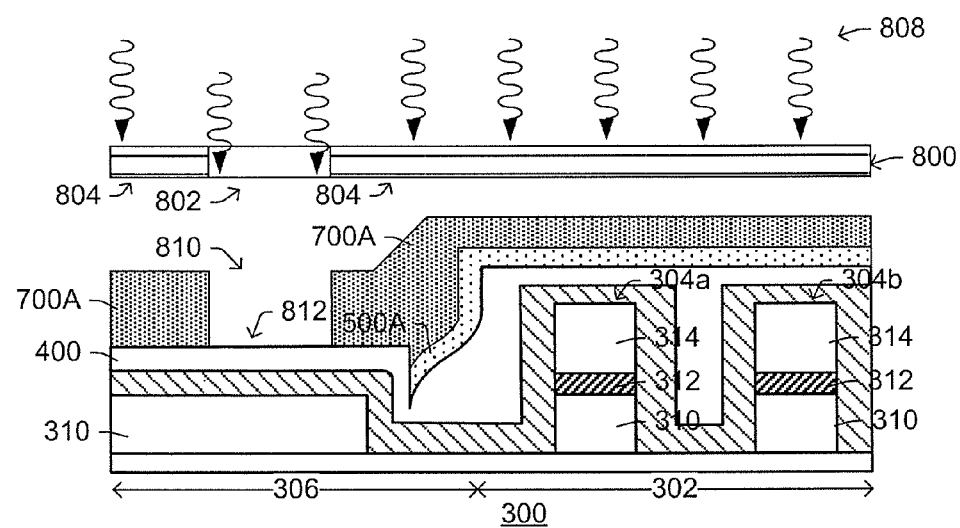

In FIG. 8, a second photomask 800, such as a reticle, is provided over the second photoresist layer. Like the first photomask 600, the second photomask 800 includes one or more window regions 802 through which photons can pass and one or more blocking regions 804 that block photons from passing therethrough. After the second photomask 800 is aligned with respect to the workpiece 300, a stream of photons 808 is applied to the workpiece while the second photomask is in place. The stream of photons, which only pass through the second photomask in the window region 802 in this example, "weaken" the exposed portion of the second photoresist layer, due to the positive photoresist tone for the second photoresist layer in this example. The workpiece 300 is subsequently subjected to (e.g., immersed in) a photoresist developing agent to form a patterned second photoresist layer 700A. As shown, after being developed, the patterned second photoresist layer 700A includes second opening 810 that at least partially overlaps the first opening to define a coincidently exposed workpiece region 812. The remaining portion of the patterned second photoresist layer 700A, which was exposed to the stream of photons 808, covers the relatively tall or relatively high-aspect ratio features 304a, 304b and can also partially cover the relatively short or relatively low aspect ratio features 308.

Figure 9:
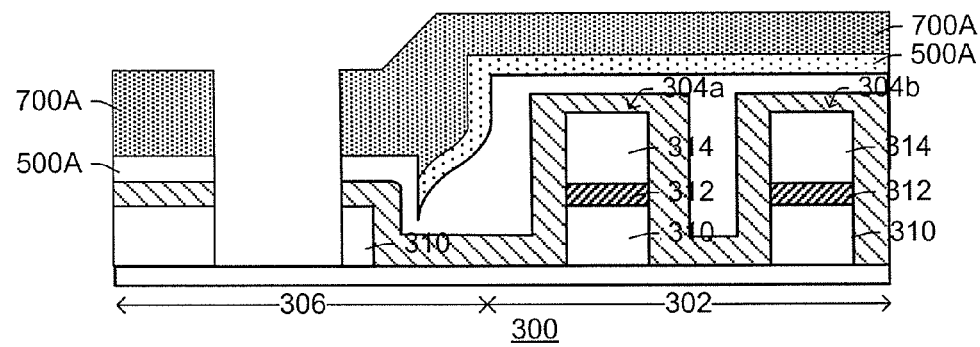

In FIG. 9, a treatment in the form of an etch is carried out. The etch removes the coincidently exposed workpiece region 812 to thereby pattern the relatively short or relatively low aspect ratio features 308 as shown.

Figure 10:
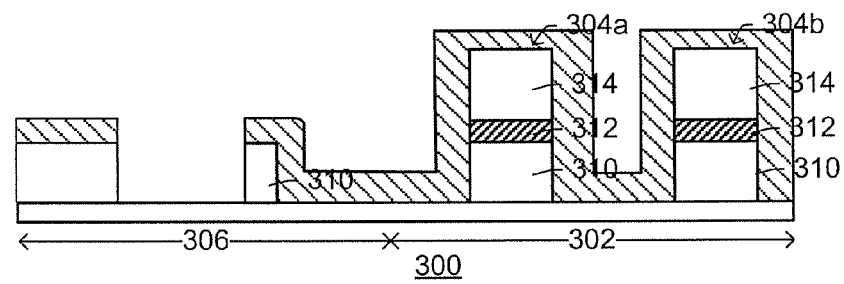

In FIG. 10, the first and second patterned photoresist layers 500A, 700A are removed, and the workpiece is cleaned so subsequent processing can take place. For example, another conductive layer or insulating layer (not shown) can be subsequently provided over the workpiece, and/or another layer of photoresist can be provided to provide further patterning of the workpiece. Notably, compared to conventional integrated circuits with varying topographies, the workpiece 300 shown in FIG. 10 exhibits relatively little or no polysilicon residue in the etched opening. Thus, the workpiece 300 has "cleaner" features then prior processes.

Thus, some embodiments of the present disclosure relate to a method for processing a workpiece, wherein the workpiece includes a higher topography region and a lower topography region. In this method, an anti-reflective coating layer is provided over the workpiece. A first patterned photoresist layer having a first photoresist tone is formed over the anti-reflective coating layer. A second patterned photoresist layer is formed over the first patterned photoresist layer, wherein the second photoresist layer has a second photoresist tone opposite the first photoresist tone. An opening extends through the first and second patterned photoresist layers and allows a treatment to be applied to the workpiece through the opening.

Other embodiments relate to a method for processing a semiconductor workpiece, wherein the workpiece includes a first region with relatively tall or relatively-high aspect ratio features and a second region with relatively short or relatively-low aspect ratio features. In this method, an anti-reflective coating layer is provided over the semiconductor workpiece. A first photoresist layer is provided over the anti-reflective coating layer, wherein the first photoresist layer has a first photoresist tone. The first photoresist layer is patterned to cover a relatively tall or relatively-high aspect ratio feature while concurrently exposing a relatively short or relatively-low aspect ratio feature. A second photoresist layer is provided over the patterned first photoresist layer, wherein the second photoresist layer has a second photoresist tone opposite the first photoresist tone. The second photoresist layer is patterned to cover the relatively tall or relatively-high aspect ratio feature while concurrently exposing the relatively short or relatively-low aspect ratio feature previously exposed through the first photoresist layer. While the patterned first and second photoresist layers are in place, a treatment is performed on the exposed relatively short or relatively-low aspect ratio feature.

Still another embodiment relates to an integrated circuit made by a manufacturing process. In the manufacturing process, an anti-reflective coating layer is provided over a workpiece on which the integrated circuit is formed. A first photoresist layer is provided over the anti-reflective coating layer, wherein the first photoresist layer has a first photoresist tone. The first photoresist layer is patterned to cover a relatively tall or relatively high-aspect ratio feature of the workpiece while exposing a relatively short or relatively low-aspect ratio feature of the workpiece. A second photoresist layer is provided over the patterned first photoresist layer, wherein the second photoresist layer has a second photoresist tone opposite the first photoresist tone. The second photoresist layer is patterned to provide an opening that leaves the relatively short or relatively low-aspect ratio feature of the workpiece exposed through the first and second photoresist layers. A treatment is performed on the relatively short or relatively low-aspect ratio feature exposed through the first and second photoresist layers.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for processing a workpiece having a higher topography region and a lower topography region, the method comprising:
    providing an anti-reflective coating layer over the workpiece;
    providing a first patterned photoresist layer having a first photoresist tone over the anti-reflective coating layer;
    providing an un-patterned second photoresist layer over the first patterned photoresist layer; and
    patterning the un-patterned second photoresist layer after the second photoresist layer has been provided over the first patterned photoresist layer, wherein the second photoresist layer has a second photoresist tone opposite the first photoresist tone and wherein an opening extending through the first and second patterned photoresist layers allows a treatment to be applied to the workpiece through the opening.

2. The method of claim 1, wherein the treatment comprises an etch to remove an exposed workpiece region aligned under the opening.

3. The method of claim 2, further comprising:
    removing the first and second photoresist layers after the etch has been performed.

4. The method of claim 1, wherein the first photoresist tone corresponds to the first photoresist layer being negative photoresist and wherein the second photoresist tone corresponds to the second photoresist layer being positive photoresist.

5. The method of claim 1, wherein the second photoresist layer is formed directly on top of the first photoresist layer so that the first and second photoresist layers have surfaces that abut one another.

6. The method of claim 5, wherein the first photoresist layer is formed directly on top of the anti-reflective coating layer so that the first photoresist layer and anti-reflective coating layer have surfaces that abut one another.

7. The method of claim 1, wherein the opening is formed over the lower topography region while the first and second photoresist layers both cover the higher topography region.

8. The method of claim 7, wherein respective upper surfaces of the higher and lower topography regions are separated by a vertical distance of approximately 3000 angstroms or more.

9. A method for processing a semiconductor workpiece, wherein the workpiece includes a first region with relatively tall or relatively-high aspect ratio features and a second region with relatively short or relatively-low aspect ratio features, the method comprising:
   providing an anti-reflective coating layer over the semiconductor workpiece;
   providing a first photoresist layer over the anti-reflective coating layer, wherein the first photoresist layer has a first photoresist tone;
   patterning the first photoresist layer to cover a relatively tall or relatively-high aspect ratio feature while concurrently exposing a relatively short or relatively-low aspect ratio feature;
   providing a second photoresist layer over the patterned first photoresist layer, wherein the second photoresist layer has a second photoresist tone opposite the first photoresist tone;
   patterning the second photoresist layer to cover the relatively tall or relatively-high aspect ratio feature while concurrently exposing the relatively short or relatively-low aspect ratio feature previously exposed through the first photoresist layer; and
   while the patterned first and second photoresist layers are in place, performing a treatment on the exposed relatively short or relatively-low aspect ratio feature.

10. The method of claim 9, wherein the treatment comprises an etch to remove the exposed relatively short or relatively-low aspect ratio feature.

11. The method of claim 10, further comprising:
   removing the first and second photoresist layers after the etch has been performed.

12. The method of claim 11, wherein patterning the first photoresist layer comprises:
   providing a first photomask over the first photoresist layer, wherein the first photomask comprises: a first window region corresponding to the relatively tall or relatively high aspect ratio feature, and a first blocking region corresponding to the relatively-low aspect ratio feature.

13. The method of claim 12, wherein patterning the first photoresist layer further comprises:
   exposing the workpiece with the first photomask in place thereover to a stream of photons having a wavelength structured to interact the first photoresist layer in the first window region; and
   developing the first photoresist layer to remove the first photoresist layer corresponding to the first blocking region, thereby forming a patterned first photoresist layer.

14. The method of claim 9, wherein the first photoresist tone corresponds to the first photoresist layer being negative photoresist and wherein the second photoresist tone corresponds to the second photoresist layer being positive photoresist.

15. The method of claim 14, wherein patterning the second photoresist layer comprises:
   providing a second photomask over the second photoresist layer, wherein the second photomask comprises: a second window region corresponding to the relatively short or relatively low aspect ratio feature, a second blocking region corresponding to the relatively tall or relatively high aspect ratio feature.

16. The method of claim 15, wherein patterning the second photoresist layer further comprises:
   exposing the workpiece with the second photomask in place thereover to a stream of photons having a wavelength structured to interact the second photoresist layer in the second window region; and
   developing the second photoresist layer to remove the second photoresist layer corresponding to the second window region, thereby forming a patterned second photoresist layer.

* * * * *